United States Patent [19]

Wakamiya et al.

[11] 3,899,793

[45] Aug. 12, 1975

[54] INTEGRATED CIRCUIT WITH CARRIER KILLER SELECTIVELY DIFFUSED THEREIN AND METHOD OF MAKING SAME

[75] Inventors: Kinji Wakamiya, Tokyo; Isamu Kobayashi, Yokohama, both of Japan

[73] Assignee: Sony Corporation, Tokyo, Japan

[22] Filed: June 25, 1973

[21] Appl. No.: 373,604

Related U.S. Application Data

[62] Division of Ser. No. 233,673, March 10, 1972, Pat. No. 3,775,196, which is a division of Ser. No. 852,819, Aug. 25, 1969, Pat. No. 3,694,276.

[30] Foreign Application Priority Data

Aug. 24, 1968 Japan .......... 43-60713

Aug. 24, 1968 Japan .......... 43-60714

[52] U.S. Cl. .......... 357/48; 357/59; 357/64

[51] Int. Cl. .......... H01l 19/00

[58] Field of Search .......... 317/235 AT, 235 AQ; 357/48, 59, 64

[56] References Cited

UNITED STATES PATENTS

| | | | |
|---|---|---|---|
| 3,423,647 | 1/1969 | Kurosawa et al. | 317/235 AQ |
| 3,440,114 | 4/1969 | Harper | 317/235 AQ |
| 3,475,661 | 10/1969 | Iwata et al. | 317/235 AT |
| 3,645,808 | 2/1972 | Kamiyama et al. | 317/235 AQ |

*Primary Examiner*—William D. Larkins

*Attorney, Agent, or Firm*—Hill, Gross, Simpson, Van Santen, Steadman, Chiara & Simpson

[57] ABSTRACT

An integrated circuit with a carrier killer selectively diffused therein comprising a substrate with one or more epitaxial layers containing active circuit elements, circuit element isolation being obtained by the location of regions having a carrier killer therein. One particular feature of the disclosure is a device having gold diffused in selected regions including a polycrystalline region which surrounds at least one active circuit element in the substrate.

2 Claims, 15 Drawing Figures

INTEGRATED CIRCUIT WITH CARRIER KILLER SELECTIVELY DIFFUSED THEREIN AND METHOD OF MAKING SAME

CROSS-REFERENCE TO RELATED APPLICATIONS

This is a division of, Ser. No. 233,673, filed Mar. 10, 1972, now U.S. Pat. No. 3,775,196 which is a division of Ser. No. 852,819, field Aug. 25, 1969, now U.S. Pat. No. 3,694,276.

BACKGROUND OF THE INVENTION

1. Field of the Invention

This invention relates to an integrated circuit, and more particularly to an integrated circuit device having selected isolation regions diffused with a carrier Killer.

2. Description of the Prior Art

In conventional diffusion-type transistors, similar diodes or the like, an impurity which forms a recombination center of the carrier, commonly referred to as a killer, is mixed into a semiconductor substrate so as to shorten the storage charge time, that is, to shorten the life time of the carrier. In this case, the killer is distributed uniformly all over the surface of the semiconductor substrate, the life time of a minority carrier of the same kind is uniform. Accordingly, in the case of constituting a semiconductor integrated circuit using such a semiconductor substrate, it is impossible to shorten the life time of some of circuit elements or passive elements of the integrated circuits.

An arrangement has been proposed to avoid such a disadvantage is to provide a semiconductor substrate, form circuit elements thereon and selectively diffuse the aforementioned killer through a mask of a silicon oxide film into the semiconductor substrate from the back thereof at those areas on which are formed circuit elements whose life time is to be shortened.

With this method, however, it is difficult to control selective diffusion of the killer, for example, gold, into the semiconductor substrate in a manner to limit the diffusion only for the selected circuit elements so as to avoid its influence on the other elements, because the diffusion coefficient of the killer is very great.

Applicants know of no prior art which shows or suggests the invention herein disclosed. Reference, however, will be made to the prior art which was made of record in applicants' parent application, Ser. 852,819, now U.S. Pat. No. 3,694,276. These references are as follows:

Iwata et al., U.S. Pat. No. 3,475,661

Kurosawa et al., U.S. Pat. No. 3,423,647

Harper, U.S. Pat. No. 3,440,114

Weinstein, U.S. Pat. No 3,396,456

Wolley, U.S. Pat. No. 3,440,113

Kabaya et al. "Electronics International - Quick Curtain,"

Electronics, Vol. 41, No. 20, Sept. 30, 1968, p. 209.

The Iwata et al. patent (assigned to the same assignee as the present invention) shows polycrystalline regions separating monocrystalline regions from each other. It is pointed out that the polycrystalline regions will diffuse an impurity much more rapidly than the monocrystalline regions and, therefore, provides pn junction isolation. Iwata does not show selective diffusion of a carrier killer material through the polycrystalline material, and, therefore, does not obtain the extremely good use of a carrier killer as an isolation means.

Kurosawa et al describes the diffusion of a carrier killer material, such as gold, but not through a polycrystalline region.

Harper describes the diffusion of gold through stressed portions, but not through a polycrystalline region.

Weinstein describes diffusion of an impurity through a roughened surface, but not through a polycrystalline region.

Wolley describes diffusion of gold decomposed from a gold compound, but not through a polycrystalline region and does not show a selective diffusion of a carrier killer material.

The Kabaya et al article describes making polycrystalline regions, but does not diffuse through the polycrystalline regions and there is no carrier killer diffusion. Furthermore, the article has a date which is subsequent to applicants' priority date.

SUMMARY OF THE INVENTION

The present invention embodies an integrated circuit device formed on a substrate in which certain circuit elements have their life time shortened by having diffused therein a carrier killer in locally selected areas. Such a device is obtained by utilizing the fact that the diffusion velocity of an impurity into a polycrystalline semiconductor is far higher than that into a single crystal semiconductor.

Accordingly, one object of this invention is to shorten the life time of one portion of the carrier of a passive or active element of an integrated circuit.

Another object of this invention is to provide a transistor in which the storage charge time or the switching time is short.

The specific object of the present invention is to provide a novel device having an integrated circuit which includes a plurality of circuit elements at least some of which are active and which are provided in a substrate adjacent one face thereof and have a polycrystalline region surrounding and spaced from the active surface element through which a carrier killer material has been diffused, thereby to provide isolation of such circuit element from other circuit elements formed in the same substrate.

Other objects, features and advantages of this invention will become apparent from the following description taken in conjunction with the accompanying drawings.

DESCRIPTION OF THE PREFERRED EMBODIMENTS

In FIG. 1 there is illustrated one example of a method of making an integrated circuit embodying the features of the present invention.

Figure 1A:
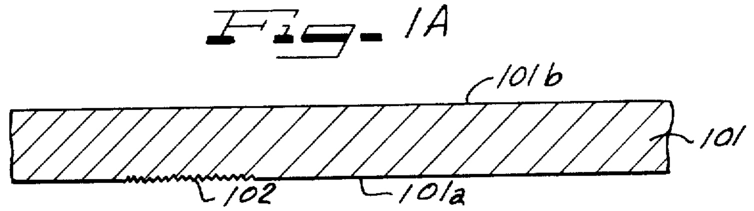
FIGS. 1A to 1E are enlarged schematic cross-sectional views showing, by way of example, a sequence of steps involved in the manufacture of the novel integrated circuit according to this invention.

The manufacture of the device begins with the preparation of a single crystal semiconductor substrate 101 formed of a semiconductor material of one conductivity type such as silicon, germanium or the like. The opposing surfaces 101*a* and 101*b* of the substrate 101 are treated to be flat and smooth and a seeding site 102 for the polycrystalline development is formed on one surface 101*a* at a place where a circuit element of short life time will be ultimately formed, as illustrated in FIG. 1A. The formation of the seeding site 102 may take place by scratching the surface 101*a* of the substrate 101 at the selected area to disturb the regularity of the lattice in the substrate 101 or by depositing on the selected area a material having a lattice constant different from that of the substrate 101 or by vapor-depositing on the selected area silicon or like material having substantially no masking effect against a killer to form a non-crystalline or polycrystalline layer.

Figure 1B:
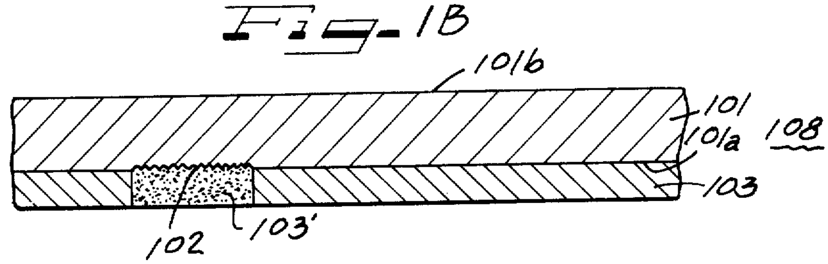

Then, a semiconductor material such as silicon, germanium or the like having the same conductivity type as that of the substrate 101 is deposited by the vapor growth techniques on the surface 101*a* of the substrate 101 to form thereon a semiconductor layer 103, thus providing an integrated circuit wafer 108 as shown in FIG. 1B. The semiconductor layer 103 thus formed consists of a single crystal region grown directly on the surface 101*a* of the substrate 101 and a polycrystalline region 103' grown on the seeding site 102.

Figure 1C:
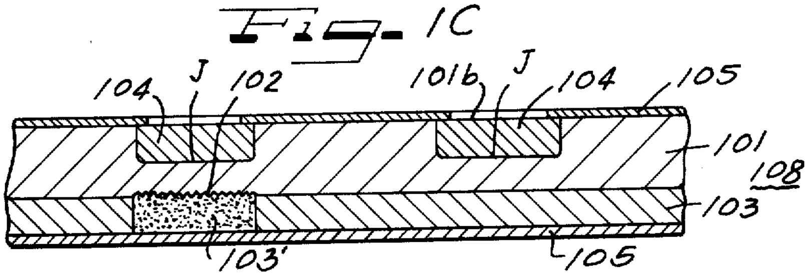

Thereafter, in order to form junctions J for isolation use on the other surface 101*b* of the substrate 101, an impurity of the opposite conductivity type to that of the substrate 101 is selectively diffused into the substrate 101 from the surface 101*b*, thus forming a plurality of island regions 104 surrounded by the junctions as illustrated in FIG. 1C. Reference numeral 105 designates insulating layers as of silicon dioxide which are deposited on the surfaces of the substrate 101 as masks for the selective impurity diffusion.

This is followed by the formation of integrated circuit elements on the side of the surface 101*b* in each island region 104. In the present example, a transistor Tr of short life time is to be formed in one of the island regions 104, so that one island region 104 is located opposite the polycrystalline region 103'.

Figure 1D:
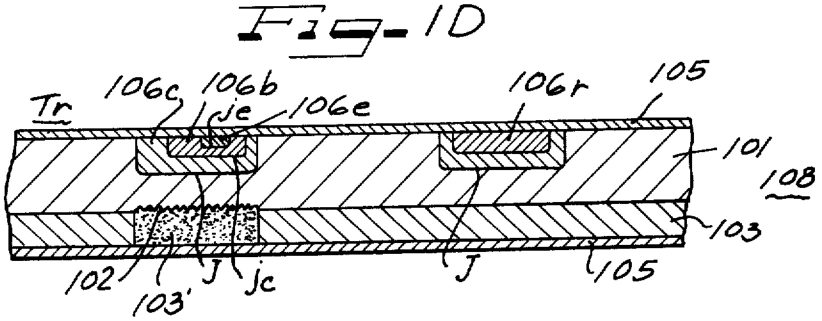

Namely, selective impurity diffusion into the region 104 is repeatedly carried out to form a base region 106*b* in the region 104 serving as a collector region 106*c* to form a collector junction *jc* therebetween and to form an emitter region 106*e* in the base region 106*b* to provide an emitter junction *je* therebetween, as shown in FIG. 1D. While, in the other island region 104 there is provided other circuit, for example, a resistance region 106*r*, as depicted in the figure.

Following this, the insulating layer 105 underlying the semiconductor layer 103 is selectively removed, for example, by means of photo-etching to form therein a window 107 under the polycrystalline semiconductor region 103' of the semiconductor layer 103. Then, an impurity layer 110 as of gold Au, copper Cu or the like, which serves as a killer of the carrier, that is, forms a carrier recombination center, is vapor-deposited on the entire surface of the wafer 108 on the side of the semiconductor layer 103 in such a manner that the impurity layer is deposited directly on the polycrystalline region 103' through the window 7.

Figure 1E:
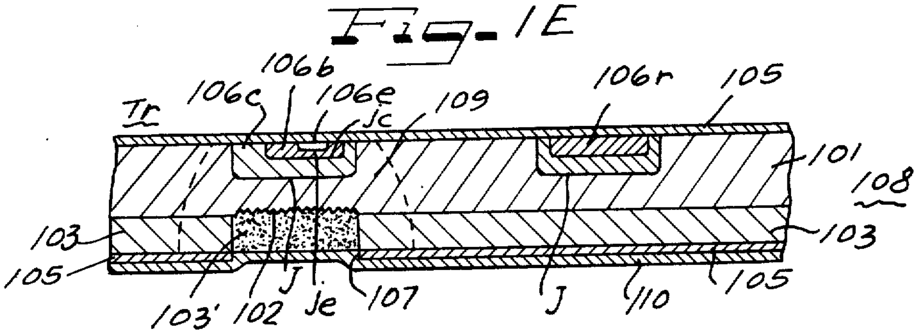

Next, the resulting assembly is subjected to a heating treatment at a temperature of 750° to 850°C. for 5 to 10 minutes, thereby to form a diffusion region 109 of the aforementioned impurity as shown in FIG. 1E, after which unnecessary areas of the impurity layer 110 is removed when required. The diffusion velocity of gold or copper in the polycrystalline region is far higher than that in the single crystal region, for example, the difference in the diffusion coefficient of the impurity is on the order of about $10^5$. Accordingly, the impurity rapidly diffuses into the polycrystalline region 103' in the above process. Therefore, when the transistor (T*r*) is positioned close to the polycrystalline region 103' by suitably selecting the thickness of the substrate 101, the diffusion region 109 can be formed locally only at the portion of the transistor (T*r*) by selecting the impurity diffusion time short, since the impurity is diffused into the polycrystalline region 103' as if to make it an impurity source over its entire area.

Then, the circuit elements are electrically interconnected in a predetermined pattern on the surface 101*a* of the substrate 101 through the insulating layer 105, thus providing a desired semiconductor integrated circuit.

With the present invention described above, the polycrystalline region 103', in which the killer diffusion velocity is higher than in the single crystal region, is located closely under the area where a circuit element of short storage charge time, in the above example the transistor element (T*r*) is to be formed, so that, by selecting the impurity diffusion time to be short, the impurity can be diffused into the area of the transistor (T*r*) to shorten the life time of the carrier in that area, providing for increased switching speed of the transistor (T*r*), but unnecessary diffusion of the killer to other areas can be sufficiently prevented.

Consequently, since other circuit elements, which are not required to be of short life time, can be formed in close proximity to the region of the transistor (T*r*) of short life time, the distance between the circuit elements can be shortened, thus enabling miniaturization of the overall integrated circuit.

Figure 2A:
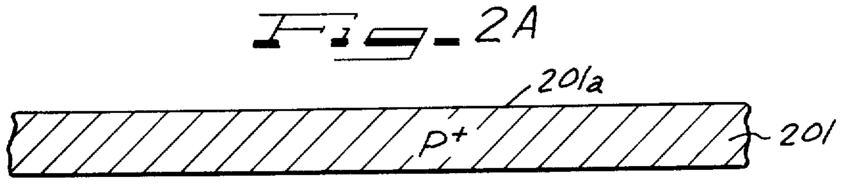
FIGS. 2A to 2J are similar enlarged cross-sectional views showing a series of steps employed in the manufacture of an integrated circuit embodying another form of this invention.

FIG. 2 illustrates a different form of this invention the first step of the manufacture is to prepare a single crystal semiconductor substrate 201 of high impurity or low resistivity which is formed of a semiconductor material such as silicon, germanium or the like of one conductivity type, for example, the P-type one, as shown in FIG. 2A.

Figure 2B:
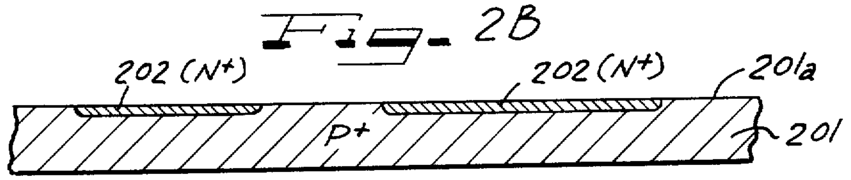

Then, a plurality of low-resistivity island regions 202 of the opposite conductivity type to that of the substrate 201, that is, N-type in this example, is formed by selective impurity diffusion into the substrate 201 on one surface 201*a* thereof at those areas where electrically isolated circuit elements will be ultimately formed, as depicted in FIG. 2B.

Figure 2C:
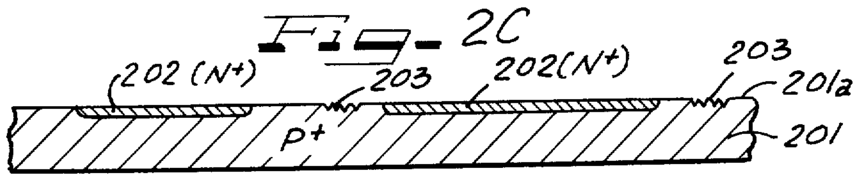

Subsequent to or prior to the formation of the island regions 2, an annular seeding site 203 for the polycrystalline development is formed on the surface 201*a* around the region 202 in which a circuit element of short life time will be ultimately formed, as depicted in FIG. 2C. The formation of the seeding site 203 may be accomplished by roughening the surface 201*a* of the substrate 201 to disturb the regularity of the lattice in the substrate 201 or by depositing on the surface 201*a* a material having a lattice constant different from that of the substrate 201 or by selectively vapor-depositing a material such as silicon or the like having substantially no masking effect against a killer to form a non-crystalline or polycrystalline layer.

Figure 2D:
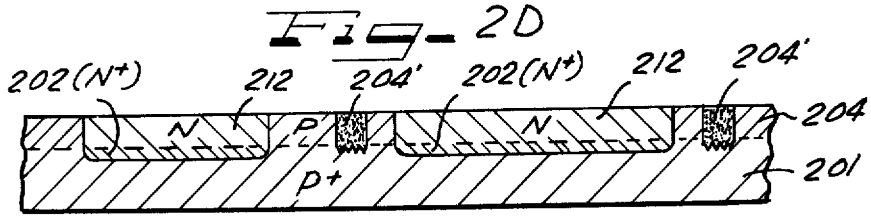

Thereafter, a low impurity concentration, that is, high resistivity semiconductor material such as silicon, germanium or the like is deposited by means of vapor growth on the surface 201*a* of the substrate 201 to form thereon a semiconductor layer 204 as shown in FIG. 2D. The semiconductor layer 204 thus formed consists of an annular polycrystalline semiconductor region 204' grown on the seeding side 203 and a single crystal semiconductor region grown directly on the surface 201*a* of the substrate 201. Further, the P-type impurity in the substrate 201 and the N-type impurity in the regions 202 are diffused, by the heating for the above vapor growth process, into the semiconductor layer 204, by which island regions 212 consisting of an N-type region formed contiguous to the regions 202 are formed in a P-type region formed contiguous to the P-type region of the substrate 201.

Figure 2E:
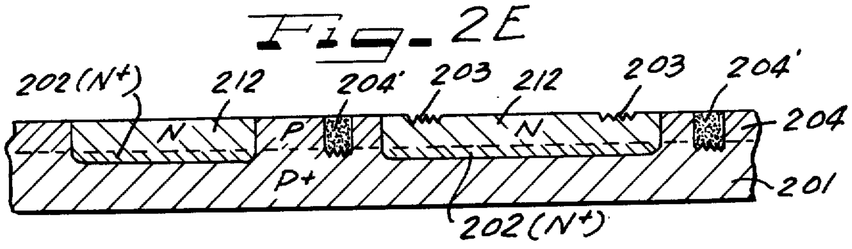

Following this, an annular seeding site 203 similar to the aforementioned one is formed on the region 212 of the semiconductor layer 204 as illustrated in FIG. 2E.

Figure 2F:
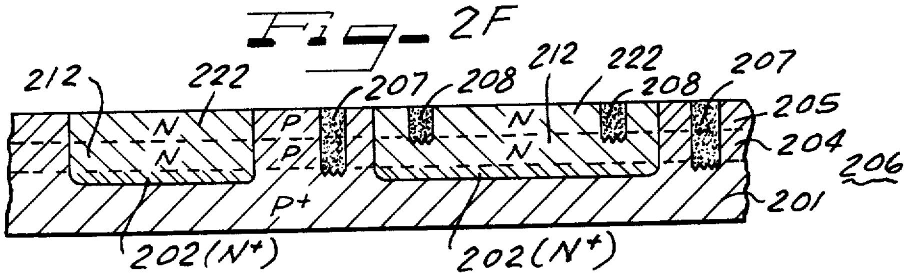

Then, a high resistance semiconductor material is deposited by the vapor growth techniques on the semiconductor layer 204 containing the seeding site 203 to form a semiconductor layer 205, thus providing a semiconductor integrated circuit wafer as depicted in FIG. 2F. The semiconductor layer 205 thus formed includes an annular polycrystalline region 207 grown on the polycrystalline region 204' of the semiconductor layer 204 overlying the seeding site 203 and a similar annular polycrystalline region 208 grown on the seeding site 203 located inside of the region 212. Also in this case, during the vapor growth of the semiconductor layer 205 the impurities in the semiconductor layer 204 are diffused into the layer 205, by which island regions 222 contiguous to the regions 212 and electrically isolated by PN junctions from each other are formed in the P-type region formed contiguous to that of the semiconductor layer 204. In the event that the regions 222 does not reach the upper surface of the semiconductor layer 205, it is possible to form the regions 222 by selectively diffusing an N-type impurity from the upper surface of the layer 205.

Figure 2G:
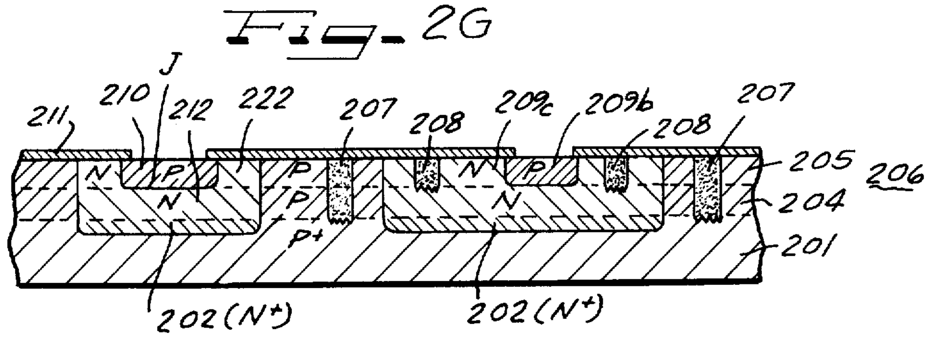

Next, a P-type impurity opposite in conductivity type to the regions 222 is selectively diffused into an area surrounded by the polycrystalline region 208 within the region 222, thus forming a base region 209*b* in the region 222 serving as a collector 209*c* as illustrated in FIG. 2G. In order to form other circuit element, for example, a diode in the other region 222 simultaneously with the above operation, it is possible to form a junction J by selective diffusion of the P-type impurity. Reference numeral 211 indicates an insulating layer formed as of silicon dioxide on the surface of the wafer 206 and used as a mask for the selective diffusion.

Figure 2H:
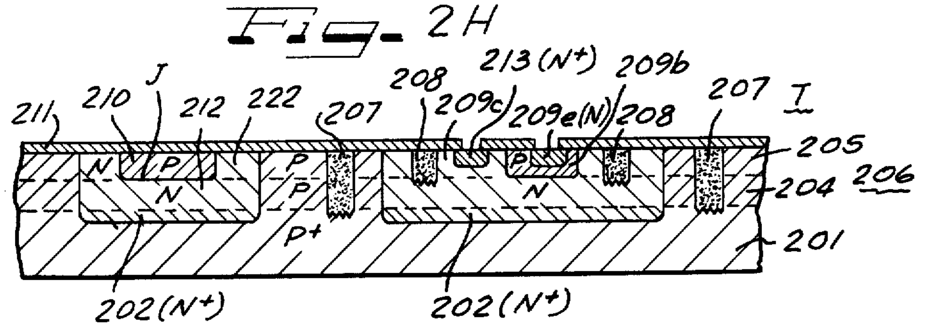

Further, an N-type impurity opposite in conductivity type to the base region 209*b* is selectively diffused into the base region 209*b* with high concentration to form therein an emitter region 209*e*, thus providing a transistor (T*r*). Simultaneously with the formation of the emitter region 209*e*, a low resistance region 213 for electrode attachment may be formed by diffusion on the collector region 209*c* at a place where an electrode will be subsequently formed, as shown in FIG. 2H.

Figure 2I:
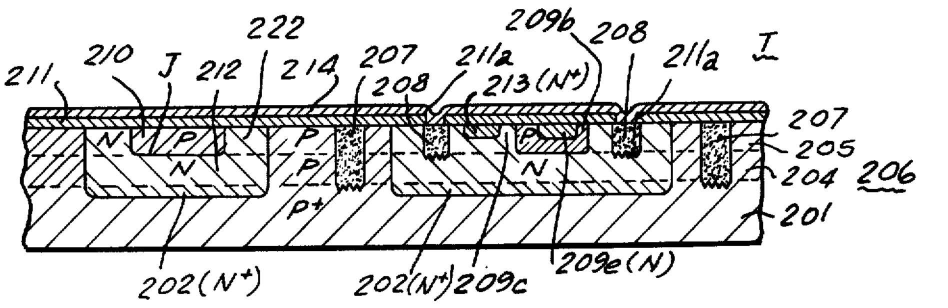
Figure 2J:
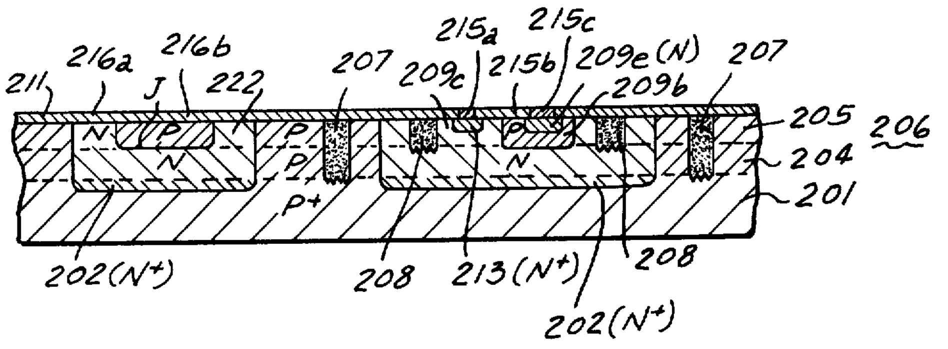

After this, the insulating layer 211 overlying the polycrystalline region 208 is selectively removed, for example, by photoetching to form an annular window 211*a* on the region 208 and a killer, that is, an impurity such as, for example, gold (Au) or copper (Cu), which forms a carrier recombination center, is deposited by means of vapor-deposition or the like, as indicated by 214, on the entire surface of the wafer 206 covering the insulating layer 211 in such a manner that the impurity may be deposited directly on the polycrystalline region 208 through the window 211*a*. In this case the upper surface of the wafer 206 except the area overlying the polycrystalline region 208, that is, except the area on the window 211*a*, is entirely covered with the insulating layer 211 to cover the window for the selective diffusion of the regions 209*e* and 213 simultaneously with or prior to the selective diffusion. The resulting assembly is subjected to a heating treatment at 750° to 850°C. for 5 to 10 minutes (FIG. 2I). As a result of this, the impurity in the layer 214 is rapidly diffused into the polycrystalline region 208 and the region 208 acts as if it were an impurity source, so that the aforementioned impurity, that is, the killer is diffused from the region 208 into the single crystal regions surrounded by the region 208 and outside thereof and the killer finally reaches the outer polycrystalline region 207. The killer reaching the region 207 is diffused thereinto as it were absorbed thereinto, thus providing a killer diffusion region. By selecting short the time for this diffusion, the impurity diffusion can be easily controlled such that the impurity may hardly diffuse into the single crystal region outside of the polycrystalline region 207 because the impurity diffusion velocity in the single crystal is far lower than that in the polycrystal and because the impurity concentration is low in that single crystal region. Further, although the impurity diffusion is carried out in a short time as above described, the impurity diffuses into the polycrystalline region 207 completely down to its bottom, since the impurity diffusion velocity is high in the polycrystalline region. Consequently, by selecting the depth of the polycrystalline region 207 to exceed the length of the collector junction jc formed between the collector region 209*c* and the base region 209*b*, the killer can be diffused into the entire area of at least the transistor (T*r*).

Finally, the impurity layer 214 of unnecessary areas is removed, after which collector, base and emitter electrodes 215*c*, 215*b* and 215*e* are respectively formed on the regions 213, 209*b* and 209*c* of the transistor (T*r*) and a pair of electrodes 216*a* and 216*b* are respectively formed on the regions which form the junction J therebetween.

The article described results from employing the described method which ensures shortening of the life time of a particular transistor or other circuit element or elements by selective diffusion of a killer.

In the foregoing examples, the polycrystalline regions are formed annular but they may be circular or square-frame like in shape. Further, these regions need not always be completely closed and in some cases, they may be of an open-ended, annular shape.

In addition, in the second example the collector electrode 215*c* is formed on the low resistance region 213 formed on an area different from the polycrystalline region 208 so as to provide for lowered collector saturated resistance, but the collector saturated resistance can be decreased by providing the collector electrode 215*c* on the region 208 without forming such a low resistance region, since the impurity has diffused into the polycrystalline region 208 in high concentration to render the region low in resistance.

While the present invention has been described as applied to the shortening of the storage charge time, that is, the switching time of the transistor, it will be understood that the invention is applicable to the shortening of the life time of circuit elements such as a diode or the like other than the transistor.

It will be apparent that many modifications and variations may be effected without departing from the scope of the novel concepts of this invention.

We claim as our invention:

1. A semiconductor device having a plurality of circuit elements therein comprising a semiconductive substrate of one conductivity type, a plurality of islands of the opposite conductivity type formed in one face thereof, a first monocrystalline epitaxial layer formed on said one face of said substrate, a second monocrystalline epitaxial layer formed on said first epitaxial layer, a circuit element formed in said epitaxial layers, a first polycrystalline ring in said second epitaxial layer around and spaced from at least a portion of said circuit element, a second polycrystalline ring around and spaced from said first ring extending in depth from the outer face of said second epitaxial layer through both epitaxial layers to said substrate, both of said polycrystalline rings having diffused therein a carrier killer, the carrier killer of said first ring being out diffused to said second ring through the intervening monocrystalline region of said epitaxial layers.

2. A semiconductor device having a plurality of active circuit elements therein comprising a semiconductor substrate of one conductivity type, a plurality of islands of the opposite conductivity type formed in one face thereof, a first monocrystalline epitaxial layer formed on said one face of said substrate, a second monocrystalline epitaxial layer formed on said first epitaxial layer, an active circuit element formed in said epitaxial layers, a first polycrystalline ring in said second epitaxial layer around and spaced from at least a portion of said active circuit element, a second polycrystalline ring around and spaced from said first ring extending in depth from the outer face of said second epitaxial layer through both epitaxial layers to said substrate, said first polycrystalline ring having diffused therein a carrier killer which is out diffused into adjacent monocrystalline regions which form at least a part of said active elements.

* * * * *